United States Patent
Li et al.

(10) Patent No.: US 12,237,149 B2
(45) Date of Patent: Feb. 25, 2025

(54) REDUCING ASPECT RATIO DEPENDENT ETCH WITH DIRECT CURRENT BIAS PULSING

(71) Applicant: Applied Materials, Inc., Santa Clara, CA (US)

(72) Inventors: Deyang Li, Santa Clara, CA (US); Sunil Srinivasan, San Jose, CA (US); Yi-Chuan Chou, Santa Clara, CA (US); Shahid Rauf, Pleasanton, CA (US); Kuan-Ting Liu, Santa Clara, CA (US); Jason A. Kenney, Campbell, CA (US); Chung Liu, Foster City, CA (US); Olivier P. Joubert, Santa Clara, CA (US); Shreeram Jyoti Dash, San Jose, CA (US); Aaron Eppler, Santa Clara, CA (US); Michael Thomas Nichols, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 154 days.

(21) Appl. No.: 17/984,772

(22) Filed: Nov. 10, 2022

(65) Prior Publication Data

US 2024/0162007 A1    May 16, 2024

(51) Int. Cl.
*H01J 37/00*    (2006.01)
*H01J 37/32*    (2006.01)

(52) U.S. Cl.
CPC .. *H01J 37/32174* (2013.01); *H01J 37/32128* (2013.01); *H01J 37/32146* (2013.01);
(Continued)

(58) Field of Classification Search
CPC .......... H01J 37/32174; H01J 37/32128; H01J 37/32146; H01J 2237/3341; H01J 2237/3346; H01J 37/32027
See application file for complete search history.

(56) References Cited

U.S. PATENT DOCUMENTS 11,569,066 B2 *  1/2023  Cubaynes ............... H02M 7/49
11,694,876 B2 *  7/2023  Rogers ............. H01J 37/32091
                                                    438/714
(Continued)

FOREIGN PATENT DOCUMENTS

JP    2021-141050 A    9/2021
WO    2021-207002 A1   10/2021

OTHER PUBLICATIONS

PCT Notification of Transmittal of the International Search Report and the Written Opinion of the International Searching Authority for International Application No. PCT/US2022/053551; dated Aug. 3, 2023.

*Primary Examiner* — Tuan T Lam
(74) *Attorney, Agent, or Firm* — Patterson + Sheridan, LLP (57) ABSTRACT

Embodiments of the present disclosure generally relate to a system used in a semiconductor device manufacturing process. More specifically, embodiments provided herein generally include apparatus and methods for synchronizing and controlling the delivery of an RF bias signal and a pulsed voltage waveform to one or more electrodes within a plasma processing chamber. The apparatus and methods disclosed herein can be useful to at least minimize or eliminate a microloading effect created while processing small dimension features that have differing densities across various regions of a substrate. The plasma processing methods and apparatus described herein are configured to improve the control of various characteristics of the generated plasma and control an ion energy distribution (IED) of the plasma generated ions that interact with a surface of a substrate during plasma processing. The ability to synchronize and control waveform characteristics of a voltage waveform bias established on a substrate during processing allows for an improved control of the generated plasma and process of (Continued)

forming, for example, high-aspect ratio features in the surface of the substrate by a reactive ion etching process. As a result, greater precision for plasma processing can be achieved, which is described herein in more detail.

19 Claims, 6 Drawing Sheets

(52) U.S. Cl.
CPC . *H01J 37/32027* (2013.01); *H01J 2237/3341* (2013.01); *H01J 2237/3346* (2013.01)

(56) References Cited

U.S. PATENT DOCUMENTS

| | | | | |
|---|---|---|---|---|
| 11,789,790 | B2 * | 10/2023 | Estep | G06F 9/3851 |
| | | | | 719/318 |
| 2011/0309049 | A1 | 12/2011 | Papasouliotis et al. | |
| 2017/0256415 | A1 | 9/2017 | Kim et al. | |
| 2021/0183622 | A1 * | 6/2021 | Koshimizu | H01J 37/32155 |
| 2021/0358717 | A1 * | 11/2021 | Kim | H01J 37/32706 |

* cited by examiner

REDUCING ASPECT RATIO DEPENDENT ETCH WITH DIRECT CURRENT BIAS PULSING

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology nodes advancing towards 2 nanometers (nm), the fabrication of smaller features with larger aspect ratios requires atomic precision for plasma processing. For etching processes where the plasma ions play a major role, ion energy control is always challenging the development of reliable and repeatable device formation processes in the semiconductor equipment industry. In a typical plasma-assisted etching process, the substrate is positioned on a substrate support disposed in a processing chamber, a plasma is formed over the substrate by use of a radio frequency (RF) generator that is coupled to an electrode disposed on or within the plasma processing chamber, and ions are accelerated from the plasma towards the substrate across a plasma sheath. Additionally, RF substrate biasing methods, which require the use of a separate RF biasing source in addition to the RF generator that is used to initiate and maintain the plasma in the processing chamber, have been unable to desirably control the plasma sheath properties to achieve desirable plasma processing results that will allow the formation of these smaller device feature sizes. The traditional RF generator and RF biasing methods utilize sinusoidal RF waveforms to excite the plasma and form the plasma sheath often leads to undesirable and inconsistent process results due to sinusoidal shape of the RF waveform and the inability of the RF biasing methods to adjust the ion energy during processing due to limitations in the provided sinusoidal waveform characteristics.

Additionally, one of the problems in etching features with small dimension features is the occurrence of a microloading effect, which is a measure of the variation in etch dimensions between regions of high and low feature density. The low feature density regions (e.g., isolated regions) receive more reactive etchants per unit surface area compared to the high feature density regions (e.g., dense regions) due to larger total exposed surface area in these regions, thereby resulting in a higher etching rate in the low density regions. The sidewall passivation generated from the etch by-products exhibit a similar pattern density dependence where more passivation is formed for the isolated features due to more by-products being generated in the low feature density region. The difference in reactive etchants and the passivation per surface area between these two regions increase as the feature density difference increases. Thus, in many cases, the low feature density regions are often etched at a faster rate than the high feature density regions, resulting in etched feature deformation, line edge roughness or a tapered top portion of the etched layer in the low feature density regions. Insufficient selectivity among the material layers disposed in the film stack in high and low feature density regions often results in inability to hold critical dimension of the etch features and poor patterned transfer.

Accordingly, there is a need in the art for a desirable plasma-assisted process that solves the problems described above.

SUMMARY

Embodiments provided herein generally include apparatus, plasma processing systems and methods for generation of a waveform for plasma processing of a substrate in a processing chamber.

Embodiments of the disclosure provided herein include a method of processing a substrate, comprising performing a processing sequence on a substrate disposed within a processing region of a plasma processing chamber. The processing sequence includes a first process sequence interval, a second process sequence interval and a third process sequence interval, wherein a processing region of the plasma processing chamber is evacuated to a pressure below atmospheric pressure during the first, the second, and the third process sequence intervals. The first process sequence interval includes delivering, by a voltage waveform generator, a first burst of first asymmetric voltage pulses to a bias electrode disposed within a plasma processing chamber, wherein the first burst of first asymmetric voltage pulses is provided for a first period of time; and delivering, by use of a radio frequency (RF) generator, an RF signal to an RF electrode disposed within the plasma processing chamber during the first period of time, wherein the RF signal provided during the first period of time comprises a first RF power level. The second process sequence interval includes halting the delivery of the first burst of first asymmetric voltage pulses for a second period of time; and delivering, by use of the radio frequency (RF) generator, the RF signal to the RF electrode during the second period of time, wherein the RF signal provided during the second period of time comprises a second RF power level. The third process sequence interval includes continuing to halt the delivery of the first burst of first asymmetric voltage pulses for a third period of time, and halting the delivery of the RF signal to the RF electrode for the third period of time.

Embodiments of the disclosure may further provide a plasma processing chamber that includes a voltage waveform generator; a radio frequency (RF) generator; a bias electrode disposed within the plasma processing chamber; an RF electrode disposed within the plasma processing chamber; a vacuum pump configured to evacuate a processing region of the plasma processing chamber; and a memory for storing a program to be executed by use of a processor. The program comprising instructions when executed by the processor causes a processing sequence to be performed. The processing sequence includes a first process sequence interval, a second process sequence interval and a third process sequence interval, wherein a processing region of the plasma processing chamber is evacuated, by use of the vacuum pump, to a pressure below atmospheric pressure during the first, the second, and the third process sequence intervals. The first process sequence interval includes delivering, by a voltage waveform generator, a first burst of first asymmetric voltage pulses to a bias electrode disposed within a plasma processing chamber, wherein the first burst of first asymmetric voltage pulses is provided for a first period of time; and delivering, by use of a radio frequency (RF) generator, an RF signal to an RF electrode disposed within the plasma processing chamber during the first period of time, wherein the RF signal provided during the first period of time comprises a first RF power level. The second process sequence interval includes halting the delivery of the first burst of first asymmetric voltage pulses for a second period of time; and delivering, by use of the radio frequency (RF) generator, the RF signal to the RF electrode during the second period of time, wherein the RF signal provided during the second period of time comprises a second RF power level. The third process sequence interval includes continuing to halt the delivery of the first burst of first asymmetric voltage pulses for a third period of time, and halting the delivery of the RF signal to the RF electrode for the third period of time.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments of the present disclosure generally relate to a system used in a semiconductor device manufacturing process. More specifically, embodiments provided herein generally include apparatus and methods for synchronizing and controlling the delivery of an RF bias signal and a pulsed voltage waveform to one or more electrodes within a plasma processing chamber. The apparatus and methods disclosed herein can be useful to at least minimize or eliminate a microloading effect created while processing small dimension features that have differing densities across various regions of a substrate. The plasma processing methods and apparatus described herein are configured to improve the control of various characteristics of the generated plasma and control an ion energy distribution (IED) of the plasma generated ions that interact with a surface of a substrate during plasma processing. The ability to synchronize and control waveform characteristics of a voltage waveform bias established on a substrate during processing allows for an improved control of the generated plasma and process of forming, for example, high-aspect ratio features in the surface of the substrate by a reactive ion etching process. As a result, greater precision for plasma processing can be achieved, which is described herein in more detail.

Figure 1:
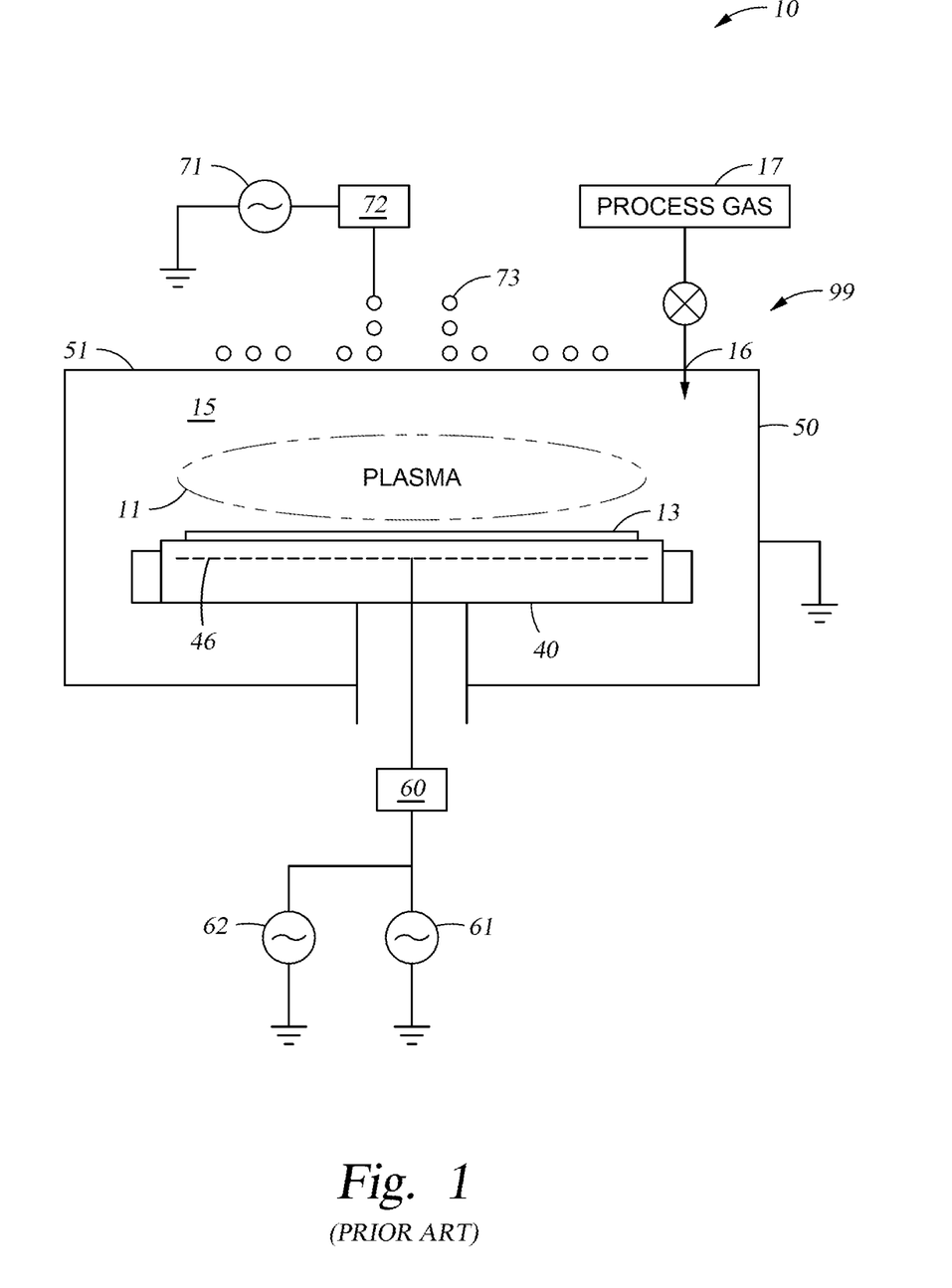
FIG. 1 is a schematic view of a conventional plasma processing system.

FIG. 1 is a schematic view of a conventional plasma processing system 10 that is adapted to process a substrate 13 disposed on a substrate support 40 by generating a plasma 11 within the processing region 15 that is enclosed by a plurality of walls 50 of a plasma processing chamber 99. The plasma processing system 10 is configured to form a inductively coupled plasma (ICP), where the processing chamber 99 includes a coil 73 disposed over a portion of the processing region 15 so that at least a portion of the coil is facing a lower electrode 46 that is disposed within substrate support 40 that is disposed within the processing region 15. The ICP plasma processing source, includes a radio frequency (RF) generator 71 that is electrically coupled to the upper coil 73 through an RF match 72, and delivers a tuned RF signal that is configured to ignite and maintain the plasma 11 formed in the processing region 15. Typically, the lower electrode 46 is coupled to ground or to a second RF power generator, which can include a radio frequency (RF) generator 61 and 62 that is electrically coupled to the lower electrode 46 through an RF match 60. However, in conventional plasma processing configurations, such as shown in FIG. 1A, in which RF signals are simultaneously being provided to one or more electrodes to form the plasma 11, the impedance of a complex load created by the plasma 11 will fluctuate at least in part due to a varying RF power levels. A gas inlet 16 disposed through a chamber lid 51 is used to deliver one or more processing gases to the processing volume 15 from a processing gas source 17 that is in fluid communication therewith.

Plasma Processing System Example

Figure 2A:
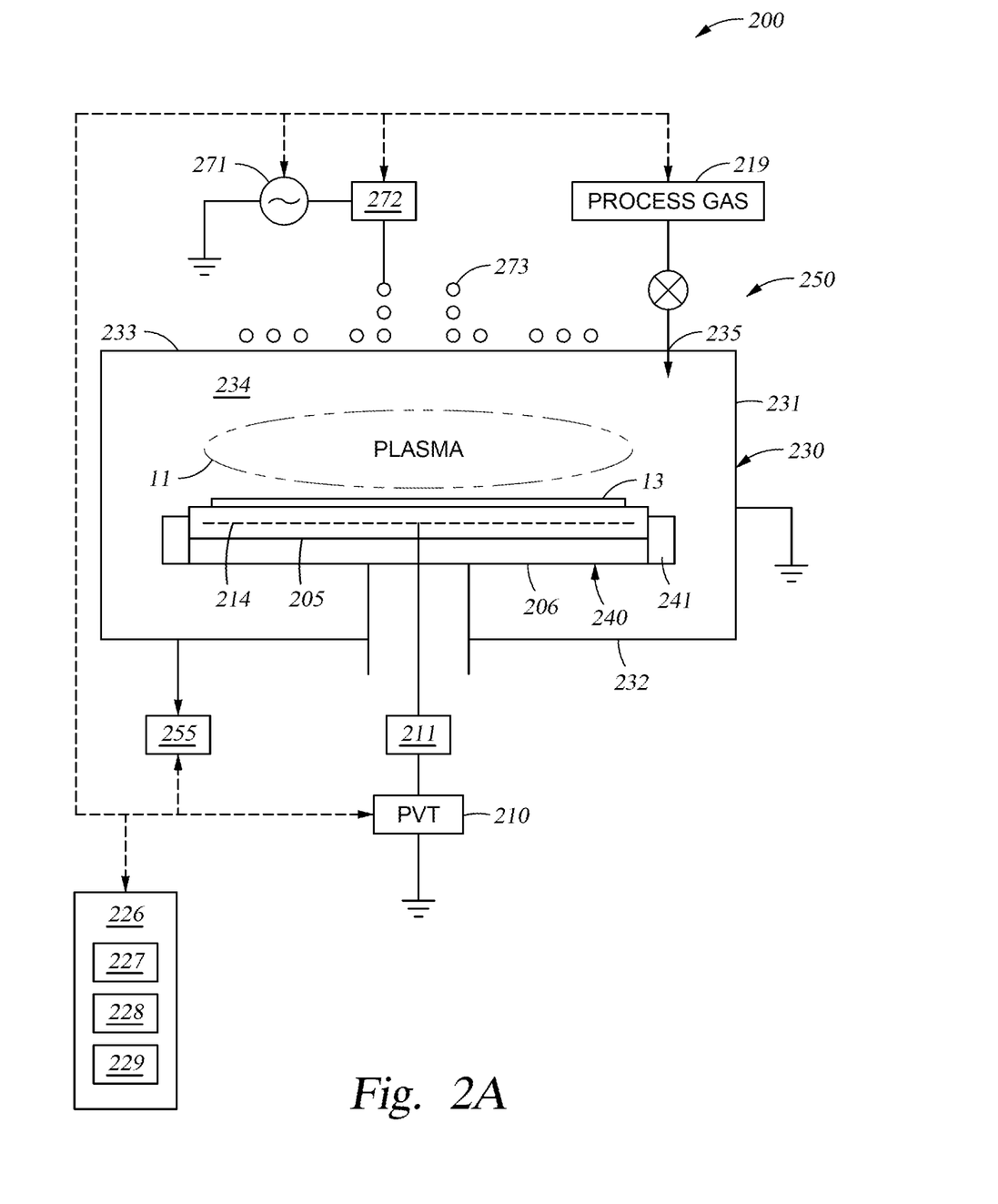
FIG. 2A is a schematic side cross-sectional view of a plasma processing system, according to one or more embodiments, configured to practice the methods set forth herein.

FIG. 2A is a schematic view of a plasma processing system 200 that is adapted to process a substrate 13 disposed on a substrate support assembly 240 by generating a plasma 11 within the processing volume 234 of a plasma processing chamber 250. The plasma processing system 200 is configured to form a inductively coupled plasma (ICP), where the processing chamber 250 includes a coil 273 disposed over a portion of the processing volume 234 so that at least a portion of the coil is facing a biasing electrode 214 that is also disposed within substrate support assembly 240 that is disposed within the processing volume 234. The biasing electrode 214 is also often referred to herein as a substrate support electrode. The ICP plasma processing source similarly includes a radio frequency (RF) generator 271 that is electrically coupled to the upper coil 273 through an RF match 272, and delivers a tuned RF signal that is configured to ignite and maintain the plasma 11 formed in the processing volume 234. The biasing electrode 214 is coupled to a pulsed voltage (PV) waveform generator 210, which is electrically coupled to the biasing electrode 214 through an RF filter 211 that is configured to prevent RF signals from making their way to the PV waveform generator 210 during processing. In some embodiments, the RF generator 271 is configured to deliver an RF waveform signal having a frequency that is greater than 1 MHz or more, or about 2 MHz or more, such as about 13.56 MHz or more through an RF match 272 that is connected to the coil 273.

The processing chamber 250 typically includes a chamber body 230 that includes one or more sidewalls 231 and a chamber base 232, which collectively, with a chamber lid 233, define the processing volume 234. The one or more sidewalls 231 and chamber base 232 generally include materials that are sized and shaped to form the structural support for the elements of the processing chamber 250 and are configured to withstand the pressures and added energy applied to them while a plasma 11 is generated within a vacuum environment maintained in the processing volume 234 of the processing chamber 250 during processing. In one example, the one or more sidewalls 231 and chamber base 232 are formed from a metal, such as aluminum, an aluminum alloy, or a stainless steel alloy. A gas inlet 235 disposed through the chamber lid 233 is used to deliver one or more processing gases to the processing volume 234 from a processing gas source 219 that is in fluid communication therewith. The processing gases provided by the processing gas source 219 will include reactive etchant gases and inert gases. The pressure within the processing chamber 250 is controlled by use of a vacuum pump 255 and an amount of gas flow provided from the processing gas source 219. A substrate 13 is loaded into, and removed from, the processing volume 234 through an opening (not shown) in one of the one or more sidewalls 231, which is sealed with a slit valve (not shown) during plasma processing of the substrate 13.

The substrate support assembly 240 can include a substrate support 205 (e.g., ESC substrate support) and one or more biasing electrodes, which are coupled to PV waveform generator 210. In some embodiments, the substrate support assembly 240 can additionally include a support structure 206 that includes a support base, which supports the substrate support 205, an insulator plate and a ground plate that is coupled to the chamber base 232. The support base is electrically isolated from the chamber base 232 by the insulator plate, and the ground plate is interposed between the insulator plate and the chamber base 232. The substrate support 205 is thermally coupled to and disposed on the support base, which is configured to regulate the temperature of the substrate support 205 during processing.

Typically, the substrate support 205 is formed of a dielectric material, such as a bulk sintered ceramic material, such as a corrosion-resistant metal oxide or metal nitride material. In embodiments herein, the substrate support assembly 240 further includes the biasing electrode 214 embedded in the dielectric material thereof. In one configuration, the biasing electrode 214 is a chucking pole used to secure (i.e., chuck) the substrate 13 to the substrate supporting surface of the substrate support assembly 240 and to bias the substrate 13 with respect to the processing plasma 11 using one or more of the pulsed-voltage biasing schemes described herein. Typically, the bias electrode 214 is formed of one or more electrically conductive parts, such as one or more metal meshes, foils, plates, or combinations thereof. In some embodiments, the biasing electrode 214 is also electrically coupled to a clamping network that is configured to provide a chucking voltage thereto, such as static DC voltage between about −5000 V and about +5000 V.

A system controller 226, also referred to herein as a processing chamber controller, includes a central processing unit (CPU) 227, a memory 228, and support circuits 229. The system controller 226 is used to control the process sequences and methods used to process the substrate 13, including the substrate processing methods described herein. The CPU 227 is a general-purpose computer processor configured for use in an industrial setting for controlling the processing chamber and sub-processors related thereto. The memory 228 described herein, which is generally non-volatile memory, may include random access memory, read-only memory, floppy or hard disk drive, or other suitable forms of digital storage, local or remote. The support circuits 229 are conventionally coupled to the CPU 227 and comprise cache, clock circuits, input/output subsystems, power supplies, and the like, and combinations thereof. Software instructions (software program) and data can be coded and stored within the memory 228 for instructing a processor within the CPU 227. A software program (or computer instructions) readable by CPU 227 in the system controller 226 determines which tasks are performable by the components in the processing system 200. Typically, the software program, which is readable by CPU 227 in the system controller 226, includes code, which, when executed by the processor (CPU 227), performs tasks relating to the plasma processing methods described herein. The program may include instructions that are used to control the various hardware and electrical components within the processing chamber 250 and processing system 200 to perform the various process tasks and various process sequences used to implement the methods described herein.

Figure 2B:
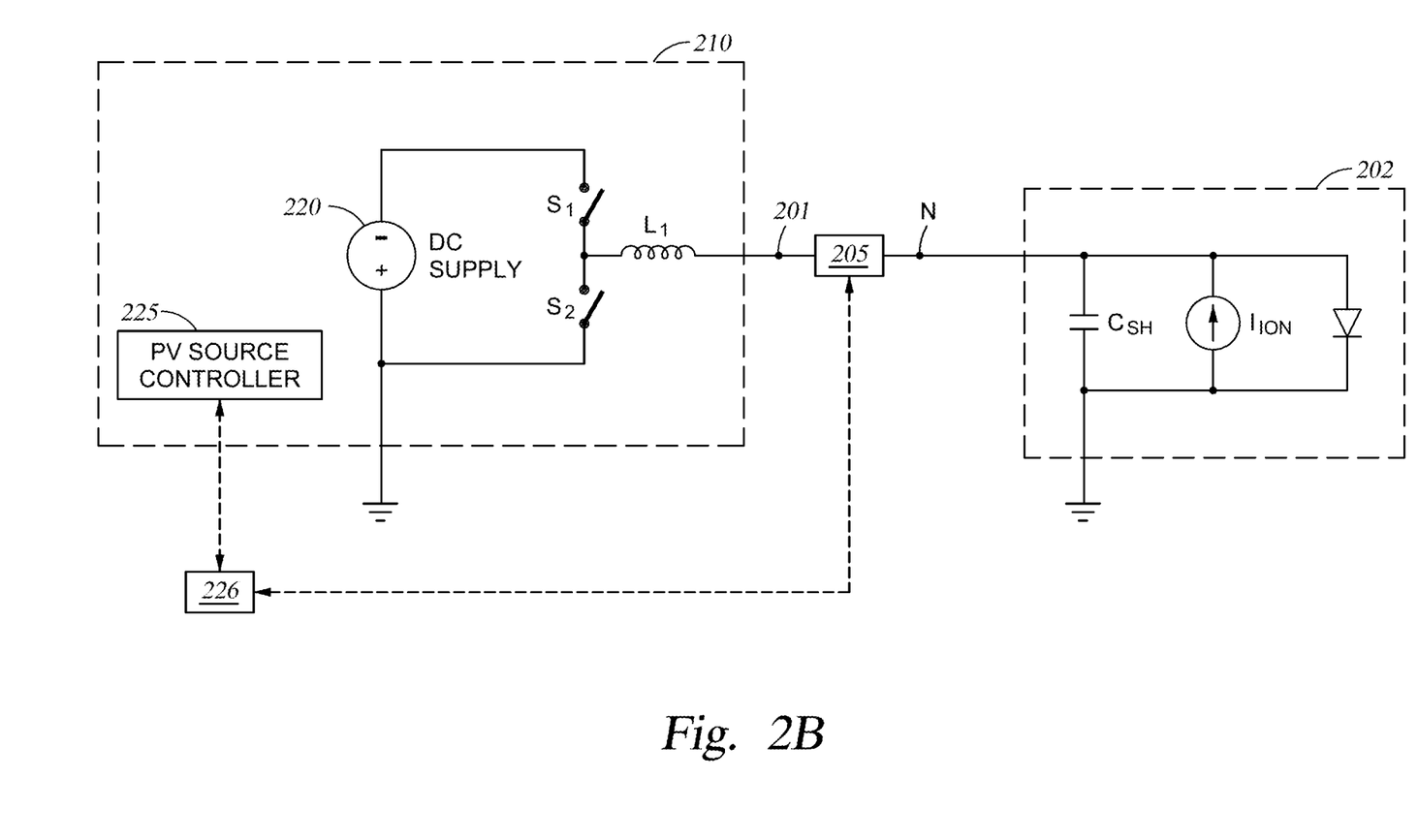
FIG. 2B is a simplified schematic of a pulsed voltage (PV) waveform generator in connection with a control system that can be configured to practice the methods set forth herein, according to one or more embodiments.

As noted above, a PV waveform generator 210 is adapted to provide a voltage waveform to one or more electrodes, such as the biasing electrode 214, disposed within the processing chamber 200. FIG. 2B is a simplified schematic of a pulsed voltage (PV) waveform generator 210 in connection with a control system that can be configured to practice the methods set forth herein, according to one or more embodiments. The PV waveform generator 210 will typically include a PV source controller 225 and at least one voltage source assembly that includes a direct current (DC) voltage source 220 that is configured to provide a PV waveform to at least one generator output 201 that is coupled to the biasing electrode 214. In one example, as shown in FIG. 2B, the PV waveform generator 210 includes a PV source controller 225 and one DC voltage source 220 that are configured to provide a PV waveform to the generator output 201. The generator output 201 can be coupled to a source node N that is coupled to the biasing electrode 214 that is capacitively or inductively coupled to a complex load 202 that is formed by the plasma 11 during plasma processing. The complex load 202 is shown as a standard electrical plasma model that represents the plasma 11 as three circuit elements. The three circuit elements include: (a) a diode, (b) a current source Iion, and (c) the capacitor $C_{SH}$, which are each present during the delivery of at least a portion of an asymmetric voltage waveform that is provided to an electrode by the PV waveform generator 210 during a plasma process. In some embodiments, the PV waveform generator 210 is a switch-mode power supply. In some embodiments, each PV waveform generator 210 is configured to deliver between 1 and 25 kilowatts (kW) of DC power at a voltage of between 100 and 10,000 volts, such as between 1000 and 5000 volts to an electrode.

Referring to FIG. 2B, the switches S1 and S2 within the PV waveform generator 210 are coupled to and in communication with the PV source controller 225 to enable the PV source controller 225 to separately open and close the switches, S1, S2 at desirable intervals to form an asymmetric voltage waveform, as disclosed below. The depicted switches S1, S2 in the PV waveform generator 210 can be realized by single pole, single throw, normally open switches that are controllable by an electrical or optical signal provided by the PV source controller 225, or MOSFET devices who's gates are controlled from signals provided by the PV source controller 225. The PV source controller 225 is also configured to control and/or adjust the voltage level generated by the DC voltage source 220 (e.g., DC supply) and provided to an output based on commands received from the system controller 226. In some embodiments, the PV source controller 225 is in direct communication with the switches S1, S2 and DC voltage source 220 so that the asymmetric voltage waveform provided to the generator output can be generated at a nanosecond or microsecond time scale.

In one or more of the embodiments disclosed herein, the PV waveform generator 210 includes a sensor assembly 205 that is positioned to measure characteristics of the PV waveform generated at the generator output. The sensor assembly 205 can include one or more electrical components that are configured to measure one or more electrical characteristics of the asymmetric voltage waveform provided by the PV waveform generator 210, such as voltage, current and offset/phase, and send the one or more electrical characteristic data to the system controller 226. The electrical characteristic data received by the system controller 226 from the PV waveform generator 210 can be used together to synchronize the delivery of other PV waveforms generated by the PV waveform generator 210 and RF generator 271, as is discussed further below.

The system controller 226 and supporting circuitry are configured to control and/or adjust the voltage waveforms generated by the PV waveform generators 210. The PV waveform generators 210, system controller 226 and supporting circuitry are able to adjust multiple electrical parameters that are used to alter one or more of the voltage waveform characteristics, such as frequency, waveform shape, and applied voltage on-time during a pulse period of a provided asymmetric voltage waveform.

While the disclosure provided herein, primarily discusses the use of the processing system 200 to perform a plasma-assisted etching processes, such as a reactive ion etch (RIE) plasma processing technique this configuration is not intended to limit the scope of disclosure provided herein. It should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

Plasma Processing Method Examples

As discussed above, embodiments of the disclosure describe a biasing scheme that is configured to provide a radio frequency (RF) generated RF waveform from an RF generator to an electrode within a processing chamber and a pulsed-voltage (PV) waveform delivered from a pulsed-voltage (PV) generator to the one or more electrodes within the processing chamber. In general, the generated RF waveform is configured to establish and maintain a plasma within the processing chamber, and the delivered PV waveform(s) are configured to establish a desired sheath voltage across the surface of a substrate during one or more phases of a plasma process and thus create a desirable ion energy distribution function (IEDF) and electron energy distribution function (EEDF) at the surface of the substrate during the one or more plasma processing phases performed on the substrate within the processing chamber. The plasma process(es) disclosed herein can be used to control the shape of IEDF and EEDF and thus the interaction of the plasma with a surface of a substrate during processing. In some configurations, the plasma process(es) disclosed herein are used to control the profile of features formed in the surface of the substrate during processing. During some semiconductor plasma processes, ions are purposely accelerated towards the substrate 13 by the voltage drop in an electron-repelling sheath that forms over the substrate 13 placed on top of a substrate support assembly 240. While not intending to be limiting as to the scope of the disclosure provided herein, the substrate support assembly 240 may also be referred to herein as the "cathode assembly" or "cathode".

Figure 3:
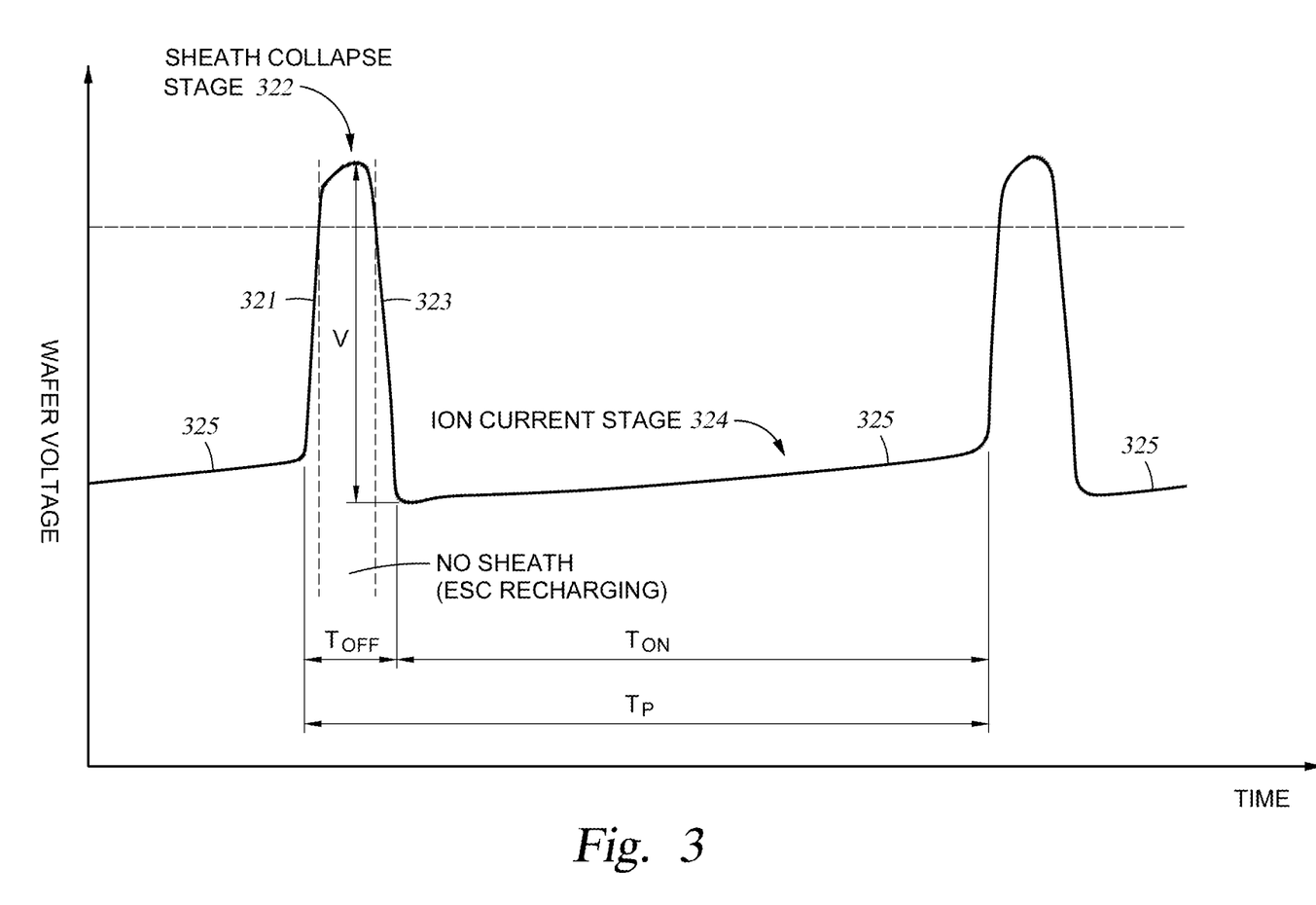
FIG. 3 illustrates an example of a voltage waveform in accordance with certain embodiments of the present disclosure.

FIG. 3 illustrates an example of a pulsed voltage waveform that includes asymmetric voltage pulses provided within the pulsed voltage waveform 325 that is established at a substrate due to the delivery of a series of asymmetric voltage pulses to a biasing electrode 214 during plasma processing by use of the PV waveform generator 210, according to certain embodiments. As noted above, it has been found that the establishment of the PV waveform on a substrate during plasma processing can be advantageously used to control aspects of the plasma sheath formed over the surface of the substrate during plasma processing. The control of the magnitude and shape of the plasma sheath formed over the surface of the substrate allows the control of the ion interaction with the surface of the substrate during processing, such as allowing the control the ion energy distribution function (IEDF), electron energy distribution function (EEDF), ion directionality, and other plasma related characteristics. Waveform 325 is an example of a non-compensated pulsed voltage (PV) waveform established at the substrate 13 during plasma processing due to the delivery of a PV waveform provided to the biasing electrode 214. A compensated pulsed voltage (PV) waveform seen at the substrate can alternatively be established by applying a negative voltage ramp to a PV waveform 325 provided to the biasing electrode 214 by a PV waveform generators 210 during an ion current stage of the pulsed voltage waveform 325.

In FIG. 3, waveform 325 includes two main stages: an ion current stage 324 and a sheath collapse stage 322. Both portions of a pulse within the waveform 325 can be sequentially established at the substrate 13 during plasma processing. At the beginning of the ion current stage 324, a drop in voltage at the substrate 13 is created (i.e., falling edge 323), due to the delivery of a negative portion of a PV waveform provided to the biasing electrode 214 by PV waveform generator 210, which creates a high voltage sheath above the substrate 13. The high voltage sheath allows the plasma generated positive ions to be accelerated towards the biased substrate during the ion current stage, and thus, for RIE processes, controls the amount and characteristics of the etching process that occurs on the surface of the substrate during plasma processing. In some embodiments, it is desirable for the ion current stage 324 to generally include a region of a pulsed voltage waveform that achieves a voltage at the substrate 13 that is stable or minimally varying throughout the stage. One will note that significant variations in voltage established at the substrate 13 during the ion current stage 324, such as shown by the positive slope in the waveform 325, will undesirably cause a variation in the ion energy distribution function (IEDF) and/or the electron energy distribution function (EEDF), and thus, cause undesirable characteristics of the etched features to be formed in the substrate during an RIE process.

At the end of the ion current stage 324, and the start of the sheath collapse stage 322, a rising edge 321 of the PV waveform 325 is created by the PV source assembly, which forms part of a typically short narrow positive pulse that transitions from a negative voltage level to a positive voltage that is greater than zero volts. The duration of the positive section of the pulse can be varied, and, in some embodiments, is between 1% and 20% of the waveform period ($T_P$), such as between 5% and 15% of the waveform period ($T_P$). In one example, the repetition frequency of the voltage pulses within the waveform 325 may be between about 100 kHz and 500 kHz, such as between 200 KHz and 400 kHz.

Figure 4:
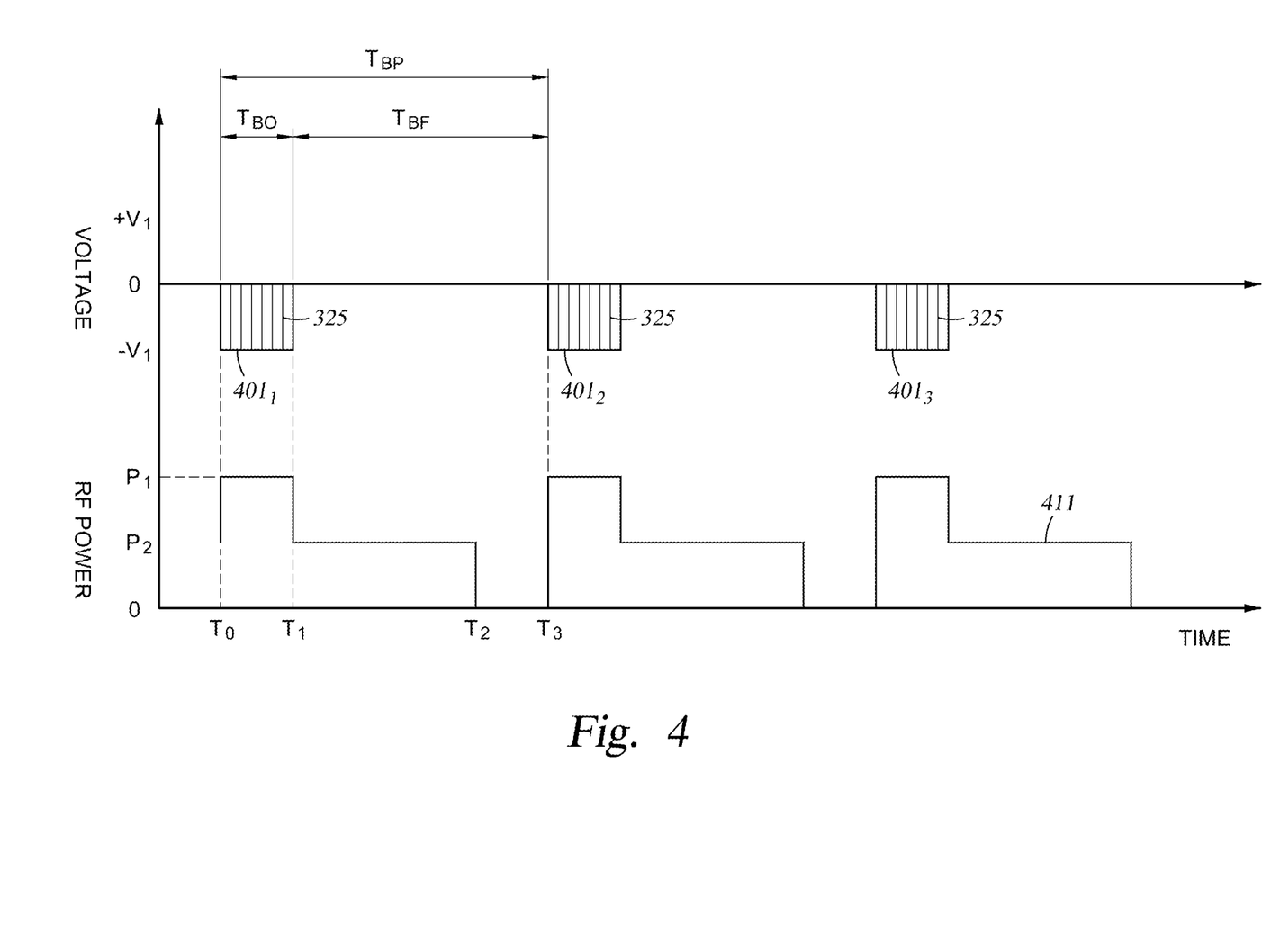
FIG. 4 illustrates bursts of voltage pulses within a generated voltage waveform and an RF waveform that are utilized during one or more methods described herein, according one or more embodiments of the disclosure provided herein.

In some embodiments, a PV waveform 325 generated by a PV waveform generators 210 includes a plurality of voltage pulse bursts 401, which are illustrated in FIG. 4. Each burst 4011, 4012, 4013 includes a portion of the pulsed voltage waveform that includes a plurality of asymmetric voltage pulses, such as the pulses illustrated in FIG. 3. In some embodiments, a bias voltage is applied during each asymmetric voltage pulse during the ion current stage 324. Stated otherwise the off-time of each voltage pulse $T_{OFF}$ occurs during the sheath collapse stage and the application of the bias voltage is applied during the on-time TON, which occurs during the ion current stage 324. The on-time TON and the off-time $T_{OFF}$ are configured as a percentage of a period $T_P$ of each voltage pulse. The frequency of each voltage pulse may be adjusted by increasing or decreasing $T_P$, while TON and $T_{OFF}$ may be adjusted by changing their relative percentage of the period $T_P$. Furthermore, the voltage pulse has an applied bias voltage V that is defined as the peak voltage during the ion current stage.

Figure 5:
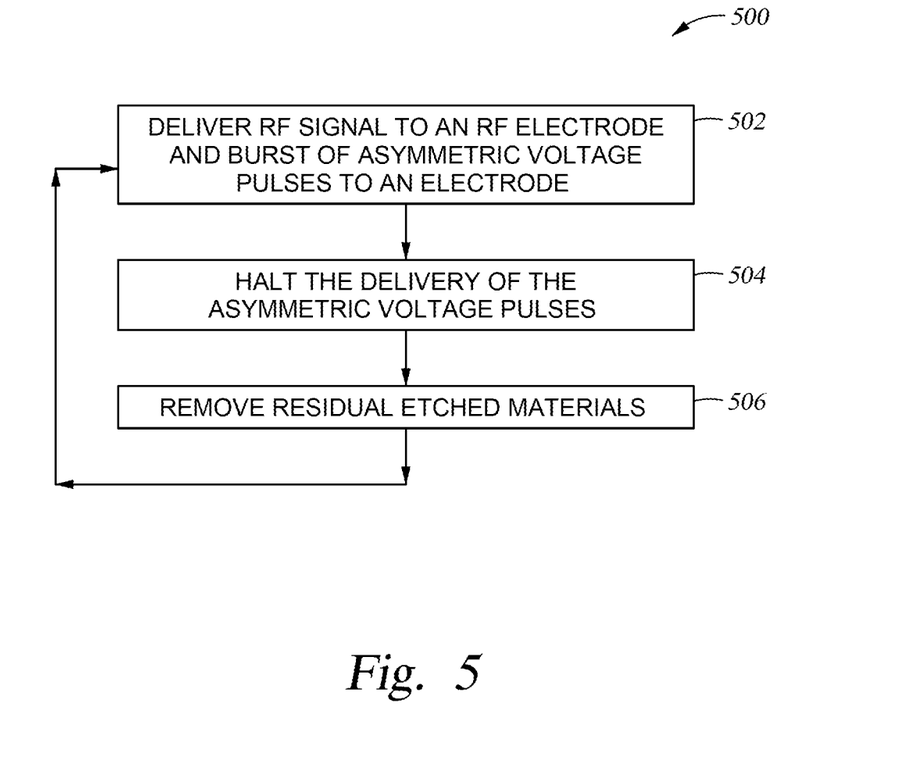
FIG. 5 illustrates a method of plasma processing a substrate by use of a process of synchronizing the delivery of an RF signal generated by the RF generator and voltage pulse bursts generated by a pulsed voltage waveform generator, according to certain embodiments.

FIG. 4 illustrates a synchronized delivery of an RF signal 411 generated by the RF generator 271 and voltage pulse bursts 401 generated by a PV waveform generator 210 and delivered to an electrode (e.g., biasing electrode 214) within the plasma processing chamber, according to certain embodiments. FIG. 5 illustrates a method 500 used to synchronize the delivery of an RF signal 411 generated by the RF generator 271 and the voltage pulse bursts 401 to at least control to improve the etching profile results and reduce the microloading effect found within features formed in the surface of the substrate after plasma processing. During processing, a PV waveform generator 210 is configured to generate a PV waveform 325 that includes multiple voltage pulse bursts 401 of voltage pulses. The characteristics of the voltage pulses within each burst 401 of voltage pulses are controlled by the PV source controller 225 and/or system controller 226. At least one parameter of the asymmetric voltage pulses that make-up each burst 401, such as the pulse on-time, ratio of pulse on-time to pulse period (i.e., percentage (%) on-time), the pulse voltage, voltage pulse repetition rate, and combinations thereof, can be adjusted by the PV source controller 225 and/or system controller 226 during processing. In some embodiments, to adapt to the variations in the IDEF, EEDF, and undesirable characteristics, such as non-uniformity of etched features, a PV waveform generators 210 may be configured to deliver bursts with different parameters based on information received by the controller 226.

Referring to FIG. 4, each voltage pulse burst 401 within the PV waveform 325 includes a burst on-time $T_{BO}$ in which the delivery of a series of asymmetric voltage pulses is provided to an electrode within the plasma processing chamber. The PV waveform 325 also includes a burst off-time $T_{BF}$ in which no asymmetric voltage pulses are provided to the electrode 214. The sum of the burst on-time $T_{BO}$ and the burst off-time $T_{BF}$ form a burst period $T_{BP}$. In some embodiments, the burst on-time $T_{BO}$ can be between about 50 µs and about 50 milliseconds (ms), such as between about 200 µs and about 5 ms, and the burst duty cycle (i.e., $T_{BO}/T_{BP}$) can be between about 5%-100%, such as between about 50% and about 95%. In one example, the burst delivery length TON is about 800 µs, and the burst duty cycle is about 80% for a voltage pulse burst 401.

As noted above, FIG. 5 illustrates a method 500 of using a plasma processing chamber according to certain embodiments. Method 500 is performed by use of a computer or programmable controller that include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 500 is performed, in part, by one or more components within the system controller 226. In some embodiments, a non-transitory storage medium stores instructions that when executed by a processor in the system controller causes the controller device to perform method 500.

For simplicity of explanation, method 500 is depicted and described as a series of operations. However, operations in accordance with this disclosure can occur in various orders and/or concurrently and with other operations not presented and described herein. Furthermore, in some embodiments, not all illustrated operations are performed to implement method 500 in accordance with the disclosed subject matter. In addition, those skilled in the art will understand and appreciate that method 500 could alternatively be represented as a series of interrelated states via a state diagram or events.

At activity 502 of method 500, a first burst 4011 (FIG. 4) of a series of bursts within the PV waveform 325 is delivered to an electrode 214 within the plasma processing system 200 and an RF signal having a first RF power level $P_1$ is simultaneously provided to an RF electrode (e.g., coil 273) within the plasma processing system 200 by use of the RF generator 271. The burst on-time $T_{BO}$ of the first burst 4011 extends, for example, a length of time that extends between times $T_0$ and $T_1$. In one example, the burst on-time $T_{BO}$ of the first burst 4011 is between about 10 µs and 800 µs, such as between 100 µs and 500 µs, or even between about 100 µs and 300 µs. In one example, the first burst 4011 includes a series of asymmetric voltage pulses that have a peak negative voltage that may be between −100 volts (V) and −2000 volts, an on-time of between about 5% and 95% of the pulse period $T_P$ (e.g., 85%), and has a repetition frequency that is between 100 kHz and 500 kHz, such as between 200 kHz and 400 kHz. The RF signal can include an RF waveform that has a frequency greater than 1 MHz, such as about 13.56 MHz or greater, and have a first RF power level $P_1$ that is between about 500 Watts (W) and 2,000 W.

Activity 502 is generally provided within the method 500 to cause the bombardment of the surface of the substrate with ions so as to cause the etching of a portion of the substrate. The etching process will also typically include the removal of material from the surface of the substrate by use of one or more reactive gases and other components formed in the plasma created by the delivery of the RF signal 411. The process of bombarding the surface of the substrate 13 during activity 502 causes the material etched from the exposed surfaces of the substrate 13 to migrate away from the surfaces from which the material was removed. However, as the aspect ratio of the features formed in the substrate increases, as the etching process performed on a substrate continues, the etched material found in the features will tend to inhibit the etching process in the lower portions of the narrower features versus the wider features, due to a greater number of collisions between the plasma generated ions and the migrating etched material (i.e., etch by-products). The variation the etching rate, created by the inhibiting material found in the differently configured features, leads to the microloading effect that is experienced across different regions of the substrate.

At activity 504, the output of the PV waveform generator 210 is halted and one or more characteristics of the RF signal provided to the RF electrode is adjusted. During activity 504 the PV waveform 325 enters a first portion of a burst off-time $T_{BF}$ period that extends for a first period of time. As shown in FIG. 4, the first portion of a burst off-time $T_{BF}$ period extends, for example, a length of time that extends between times $T_1$ and $T_2$. In one example, the first period of time is between about 100 µs and 1.2 millisecond (ms), such as between 0.5 ms and 1 ms, or even between about 0.7 ms and 0.9 ms. The RF power applied during the first portion of the burst off-time $T_{BF}$ period can be applied at second RF power level $P_2$ that is different from the first RF power level $P_1$, such as less than the first RF power level $P_1$. In one example, the second RF power level $P_2$ is between about 100 watts and about 1,000 watts, such as between 400 watts and 700 watts at an RF frequency of about 13.56 MHz or greater. Activity 504 is generally used to enable the passivation of the exposed surfaces of the substrate that were etched during activity 502 due to the presence of components found within the plasma that is being maintained by the delivery of the RF signal provided at the second RF power level $P_2$.

At activity 506, the output of the PV waveform generator 210 remains halted and one or more characteristics of the RF signal provided to the RF electrode is further adjusted. During activity 506 the PV waveform 325 enters a second portion of the burst off-time $T_{BF}$ period that extends for a second period of time. The second portion of a burst off-time $T_{BF}$ period extends, for example, a length of time that extends between times $T_2$ and $T_3$. In one example, the second period of time is between about 500 µs and 2 millisecond (ms), such as between 0.7 ms and 1.5 ms, or even between about 0.8 ms and 1.2 ms. In one example, the second period of time is between about 0.8 ms and 1.2 ms and the burst period $T_{BP}$ is between about 2 ms and 3 ms. The RF power applied during the second portion of the burst off-time $T_{BF}$ period can be applied at third RF power level $P_3$ that is different from the first RF power level $P_1$ and the second RF power level $P_2$, such as less than the first RF power level $P_1$ and second RF power level $P_2$. In one example, the third RF power level $P_3$ is adjusted to a level at or near zero watts. Activity 504 is generally used to enable the removal of the etched material from the features formed in the exposed surfaces of the substrate by a pumping process that allows the material migrating from the etched features formed in the substrate to be pumped out of the processing volume 234 by the vacuum pump 255 (FIG. 2). The pumping process is also referred to herein as a process of evacuating the processing volume 234. By periodically clearing the etch materials (e.g., etch by-products) from the features formed within the substrate, etchants are more effectively delivered to the feature being etched with a desired ion trajectory, such as a vertical trajectory.

In some embodiments, the pressure within the processing volume 234 is adjusted during each of the activities 502-506 by the adjustment of a gas flow provided from the process gas source 219 and/or flow control valves (not shown) positioned in an exhaust line that connects the vacuum pump 255 to the process chamber 250. In one embodiment, the pressure in the processing volume 234 is decreased during activity 506 versus the pressure maintained in the processing volume 234 during activities 502 and 504.

After activity 506 has been completed method 500 may include completing activities 502-506 a plurality of times. In one example, the total time it takes to sequentially complete one cycle of activities 502-506 is between about 1 ms and 3 ms and the activities 502-506 are sequentially cyclically repeated multiple times over a period of time that is between about 1 second and 60 seconds.

In some embodiments, the length of time between each of the intervals, such as the first interval between times $T_0$ and $T_1$, the second time interval between $T_1$ and $T_2$ and the third time interval between times $T_2$ and $T_3$ are varied between the different cycles of activities 502-506. In one example, during a second cycle of activities 502-506, after performing a first cycle of activities 502-506, the second time interval is decreased a first amount of time and the third time interval is increased a second amount of time. In some cases, where it is desirable to maintain the same burst period $T_{BP}$ length for each cycle of activities the first amount of time and the second amount of time are equal. In other cases, it may be desirable to adjust the length of one or more of the time intervals as needed between cycles to achieve a desired process result on a substrate, and thus the burst period $T_{BP}$ length may change from one cycle to the next cycle. In one example, during a second cycle of activities 502-506, after performing a first cycle of activities 502-506, the third time interval is increased an amount of time to account for an increase in the depth of an etched feature found after performing the first cycle of activities. In this example, the third time interval during the second cycle may be increased after the performance of a plurality of interim cycles are performed between when the first cycle and second cycle are performed. The length of one or more of the time intervals may change over time, such as, for example, the third time interval increases an amount of time every cycle, every other cycle, or every number of cycles.

While the voltage pulse bursts 4011, 4012, 4013, as shown in FIG. 4, includes a single consistent type of burst (i.e., voltage pulses within the PV waveform 325), it is contemplated that the bursts within a series of bursts could include differently configured bursts that include voltage pulses that have differing voltage pulse characteristics. In one example, two or more of the voltage pulse bursts 4011, 4012, 4013, each include a series of asymmetric voltage pulse that each have a different peak negative voltage, a different voltage pulse on-time, or a different a repetition frequency. Similarly, in some embodiments, the RF waveform within the RF signal 411 may include a series of differently configured RF signal levels or include RF pulses (not shown).

Advantageously, it is believed that by controlling the characteristics of portions of the pulsed voltage waveform and RF waveform delivered during a plasma process performed on a substrate will allow for improved etched features to be formed across a surface of the substrate. In one example, by adjusting the pulse-on-time (TON) versus pulse off-time ($T_{OFF}$) within a pulse period $T_P$ of a burst 401 has been found to improve microloading results within features formed on the surface of the substrate. It has been found that the voltage pulse repetition rate can affect other important plasma processing parameters, such as etch selectivity. In another example, controlling the pulse voltage level, such as a higher voltage level in one phase of the plasma process versus another can result in an improved ability to etch deep features in a surface of the substrate, a higher etch rate and a larger plasma sheath (and vice versa for a pulse rate), while lower voltage levels can be beneficially used for forming certain types of etched features. In another example, adjusting the rest time between bursts of voltage pulses, or second portion of the burst off-time period, can be used to provide an extra time for the etching by-products to be pumped out of the processing volume 234, which can improve etch uniformity and reduce microloading, while a shorter rest time between bursts can improve substrate throughput during plasma processing. Therefore, in some embodiments, at least one parameter of the voltage pulse within different voltage pulse bursts 401 within a PV waveform 325 may be adjusted during processing to achieve a desired plasma processing result. The combinations of different bursts that have voltage pulses that have differing characteristics can be used tune the plasma processing results seen on a substrate.

The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising performing a processing sequence on the substrate disposed within a processing region of a plasma processing chamber, wherein the processing sequence comprises:
   a first process sequence interval that comprises:
      delivering, by a voltage waveform generator, a first burst of first asymmetric voltage pulses to a bias electrode disposed within the plasma processing chamber, wherein the first burst of first asymmetric voltage pulses is provided for a first period of time; and
      delivering, by use of a radio frequency (RF) generator, an RF signal to an RF electrode disposed within the plasma processing chamber during the first period of time, wherein the RF signal provided during the first period of time comprises a first RF power level;
   a second process sequence interval that comprises:
      halting the delivery of the first burst of first asymmetric voltage pulses for a second period of time;
      delivering, by use of the RF generator, the RF signal to the RF electrode during the second period of time, wherein the RF signal provided during the second period of time comprises a second RF power level;
   a third process sequence interval that comprises:
      continuing to halt the delivery of the first burst of first asymmetric voltage pulses for a third period of time; and
      halting the delivery of the RF signal to the RF electrode for the third period of time; and
   periodically clearing etch by-products during the second process sequence.

2. The method of claim 1, further comprising sequentially repeating the first, the second and the third process sequence intervals a plurality of times.

3. The method of claim 1, wherein the third period of time is longer than the first period of time and the second period of time.

4. The method of claim 3, wherein the second RF power level is less than the first RF power level.

5. The method of claim 1, wherein delivering the first burst of first asymmetric voltage pulses comprises delivering a plurality of asymmetric voltage pulses that each have a pulse on-time that is between 5% and 95% of a pulse period, and a repetition frequency that is between 200 kHz and 500 KHz.

6. The method of claim 5, wherein the delivering the plurality of asymmetric voltage pulses by the voltage waveform generator includes applying a negative voltage to the bias electrode during the pulse on-time.

7. The method of claim 6, wherein the first period of time is between 0.1 milliseconds (ms) and 0.5 ms.

8. The method of claim 5, wherein the first period of time that is between 0.1 milliseconds (ms) and 0.5 ms.

9. The method of claim 8, wherein the first period of time is shorter than the second period of time, and the second period of time is shorter than the third period of time.

10. The method of claim 5, wherein the RF electrode comprises a coil and the bias electrode comprises an electrode disposed within a substrate support within the plasma processing chamber.

11. The method of claim 1, wherein the third period of time is between 0.5 ms and 1.5 ms and a sum of the first period of time, the second period of time, and the third period of time is between 2 ms and 3 ms.

12. The method of claim 11, further comprising sequentially repeating the first, the second and the third process sequence intervals a plurality of times.

13. The method of claim 12, wherein the third period of time is longer than the first period of time and the second period of time.

14. The method of claim 13, wherein the second RF power level is less than the first RF power level.

15. A plasma processing chamber, comprising:
   a voltage waveform generator;
   a radio frequency (RF) generator;
   a bias electrode disposed within the plasma processing chamber;
   an RF electrode disposed within the plasma processing chamber;
   a vacuum pump; and
   a memory for storing a program to be executed by a processor, the program comprising instructions when executed cause:
   a processing sequence to be performed that comprises:
      a first process sequence interval that comprises:
         delivering, by the voltage waveform generator, a first burst of first asymmetric voltage pulses to the bias electrode, wherein the first burst of first asymmetric voltage pulses is provided for a first period of time; and delivering, by use of the RF generator, an RF signal to the RF electrode during the first period of time, wherein the RF signal provided during the first period of time comprises a first RF power level;

a second process sequence interval that comprises:
halting the delivery of the first burst of first asymmetric voltage pulses for a second period of time;
delivering, by use of the radio frequency (RF) generator, the RF signal to the RF electrode during the second period of time, wherein the RF signal provided during the second period of time comprises a second RF power level; and a third process sequence interval that comprises:
continuing to halt the delivery of the first burst of first asymmetric voltage pulses for a third period of time; and
halting the delivery of the RF signal to the RF electrode for the third period of time; and periodically clearing, by use of the vacuum pump, etch by-products during the second process sequence.

16. The plasma processing chamber of claim 15, wherein the program further comprises instructions that when executed cause:
the first, the second and the third process sequence intervals to be sequentially repeated a plurality of times.

17. The plasma processing chamber of claim 15, wherein the third period of time is longer than the first period of time and the second period of time.

18. The plasma processing chamber of claim 17, wherein the second RF power level is less than the first RF power level.

19. The plasma processing chamber of claim 15, wherein delivering the first burst of first asymmetric voltage pulses comprises delivering a plurality of asymmetric voltage pulses that each have a pulse on-time that is between 5% and 95% of a pulse period, and a repetition frequency that is between 200 kHz and 500 KHz.

* * * * *